United States Patent
Shaviv et al.

(10) Patent No.: US 10,950,500 B2
(45) Date of Patent: Mar. 16, 2021

(54) METHODS AND APPARATUS FOR FILLING A FEATURE DISPOSED IN A SUBSTRATE

(71) Applicant: APPLIED MATERIALS, INC., Santa Clara, CA (US)

(72) Inventors: Roey Shaviv, Palo Alto, CA (US); Xikun Wang, Sunnyvale, CA (US); Ismail Emesh, Sunnyvale, CA (US); Jianxin Lei, Fremont, CA (US); Wenting Hou, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/971,573

(22) Filed: May 4, 2018

(65) Prior Publication Data
US 2018/0323103 A1 Nov. 8, 2018

Related U.S. Application Data

(60) Provisional application No. 62/502,147, filed on May 5, 2017.

(51) Int. Cl.
*H01L 21/768* (2006.01)
*H01L 21/67* (2006.01)
(Continued)

(52) U.S. Cl.
CPC .. *H01L 21/76883* (2013.01); *H01L 21/02068* (2013.01); *H01L 21/28568* (2013.01);
(Continued)

(58) Field of Classification Search
CPC ......... H01L 21/76883; H01L 21/76843; H01L 21/76895; H01L 21/28556;
(Continued)

(56) References Cited

U.S. PATENT DOCUMENTS

| 4,919,750 A | * | 4/1990 | Bausmith | .................. | C23F 4/00 |
|---|---|---|---|---|---|
| | | | | | 216/66 |
| 5,575,853 A | | 11/1996 | Arami et al. | | |

(Continued)

FOREIGN PATENT DOCUMENTS

KR 2007-0079870 8/2007

OTHER PUBLICATIONS

U.S. Appl. No. 15/349,460, Nov. 11, 2016, Wang et al.
(Continued)

*Primary Examiner* — Jarrett J Stark
(74) *Attorney, Agent, or Firm* — Moser Taboada

(57) ABSTRACT

Embodiments of methods and apparatus for filling a feature disposed in a substrate are disclosed herein. In some embodiments, a method for filling a feature disposed in a substrate includes (a) depositing a metal within the feature to a first predetermined thickness in a first process chamber; (b) depositing the metal within the feature to a second predetermined thickness in a second process chamber; (c) etching the metal deposited in (b) to remove an overhang of the metal at a top of the feature in a third process chamber different than the first and second process chambers; and (d) subsequent to (c), filling the feature with the metal in a fourth process chamber different than the first and third process chambers.

15 Claims, 3 Drawing Sheets

(51) Int. Cl.
*H01L 21/285* (2006.01)
*H01L 21/3213* (2006.01)
*H01L 21/02* (2006.01)
*H01L 23/532* (2006.01)

(52) U.S. Cl.
CPC .. *H01L 21/32135* (2013.01); *H01L 21/67184* (2013.01); *H01L 21/67207* (2013.01); *H01L 21/76843* (2013.01); *H01L 21/76877* (2013.01); *H01L 21/76895* (2013.01); *H01L 23/53209* (2013.01); *H01L 21/2855* (2013.01); *H01L 21/28556* (2013.01)

(58) Field of Classification Search
CPC ......... H01L 21/67207; H01L 21/28568; H01L 21/32135; H01L 21/02068; H01L 21/2855; H01L 21/02071; H01L 21/32136–32137; H01L 21/67069; H01L 21/31138; H01L 21/31122; H01L 21/31116; H01L 21/3065–30655; H01J 2237/334–3348
See application file for complete search history.

(56) References Cited

U.S. PATENT DOCUMENTS

| | | | |
|---|---|---|---|
| 5,788,825 A | 8/1998 | Park et al. | |
| 5,904,561 A * | 5/1999 | Tseng | H01L 21/76865 257/E21.584 |
| 6,162,302 A | 12/2000 | Raghavan et al. | |
| 6,495,294 B1 * | 12/2002 | Yamauchi | H01L 21/02381 257/E21.544 |
| 6,537,707 B1 | 3/2003 | Lee | |
| 6,656,848 B1 | 12/2003 | Scanlan et al. | |
| 7,052,553 B1 | 5/2006 | Shih et al. | |
| 9,564,296 B2 | 2/2017 | Kobayashi et al. | |
| 9,576,809 B2 | 2/2017 | Korolik et al. | |
| 10,049,891 B1 * | 8/2018 | Wang | H01L 21/32136 |
| 2001/0006093 A1 | 7/2001 | Tabuchi | |
| 2001/0039921 A1 | 11/2001 | Rolfson et al. | |
| 2002/0182878 A1 | 12/2002 | Hirose et al. | |
| 2003/0094134 A1 | 5/2003 | Minami et al. | |
| 2004/0107908 A1 | 6/2004 | Collins et al. | |
| 2004/0231706 A1 | 11/2004 | Bhatnagar et al. | |
| 2005/0072756 A1 * | 4/2005 | Makarov | C23F 4/00 216/63 |
| 2005/0176258 A1 | 8/2005 | Hirose et al. | |
| 2005/0266650 A1 | 12/2005 | Ahn et al. | |
| 2008/0176412 A1 | 7/2008 | Komeda | |
| 2010/0288369 A1 | 11/2010 | Chang et al. | |
| 2011/0159690 A1 * | 6/2011 | Chandrashekar | H01L 21/28556 438/675 |
| 2012/0009785 A1 * | 1/2012 | Chandrashekar | C23C 16/045 438/669 |
| 2012/0070982 A1 * | 3/2012 | Yu | H01L 21/2855 438/653 |
| 2014/0349477 A1 * | 11/2014 | Chandrashekar | H01L 21/76877 438/627 |
| 2015/0179514 A1 * | 6/2015 | Yu | H01L 21/76879 257/751 |
| 2015/0270140 A1 * | 9/2015 | Gupta | H01L 21/32136 216/67 |
| 2015/0299848 A1 * | 10/2015 | Haukka | H01L 21/76829 427/123 |
| 2017/0011931 A1 * | 1/2017 | Park | H01L 21/31116 |
| 2017/0040175 A1 | 2/2017 | Xu et al. | |
| 2017/0040190 A1 | 2/2017 | Benjaminson et al. | |
| 2017/0040191 A1 | 2/2017 | Benjaminson et al. | |
| 2017/0040207 A1 | 2/2017 | Purayath | |
| 2017/0053811 A1 * | 2/2017 | Fung | H01L 21/67069 |
| 2020/0251340 A1 * | 8/2020 | Shaviv | H01L 21/0228 |

OTHER PUBLICATIONS

Instrument Manual: Vacuum Gauge Model MM200, Rev D. TELEVAC (website: www.televac.com), A Division of the Fredericks company, Huntingdon Valley, PA, US. 2008. pp. 160.

* cited by examiner

METHODS AND APPARATUS FOR FILLING A FEATURE DISPOSED IN A SUBSTRATE

CROSS-REFERENCE TO RELATED APPLICATIONS

This application claims benefit of U.S. provisional patent application Ser. No. 62/502,147, filed May 5, 2017, which is herein incorporated by reference in its entirety.

FIELD

Embodiments of the present disclosure generally relate to methods of filling a feature disposed in a substrate.

BACKGROUND

Fabrication of integrated circuits and other microelectronic devices include processes to fill features formed in or on a substrate. Dimensions of the contacts to the source and drain regions, as well as the contact to the metal gate, have drastically decreased to less than 10 nm. The inventors have observed that conventional methods of filling contact plugs produces unacceptably high resistance because a deposited barrier layer occupies a substantial volume of the contact and, when coupled with the high resistivity of certain conventional fill materials, makes the resistance of the contact unacceptable for advanced applications.

The inventors have further observed that using typical deposition processes with ever-shrinking semiconductor devices results in the buildup of overhang in the features and the incapability to provide sufficient step coverage (e.g., coverage on bottom and sidewalls of the feature as compared to the top surface of the substrate), or more specifically, sidewall coverage with no overhang on the feature top. In particular, the undesirable buildup of material near the upper opening of the features, referred to as overhang, can cause the opening of the feature to be closed off prematurely, undesirably forming a pocket, or void, where no material is present.

Accordingly, the inventors have developed improved techniques to fill features with a conductive material.

SUMMARY

Embodiments of methods and apparatus for filling a feature disposed in a substrate are disclosed herein. In some embodiments, a method for filling a feature disposed in a substrate includes (a) depositing a metal within the feature to a first predetermined thickness in a first process chamber; (b) depositing the metal within the feature to a second predetermined thickness in a second process chamber; (c) etching the metal deposited in (b) to remove an overhang of the metal at a top of the feature in a third process chamber different than the first and second process chambers; and (d) subsequent to (c), filling the feature with the metal in a fourth process chamber different than the first and third process chambers.

In some embodiments, a method for filling a feature disposed in a substrate includes (a) depositing a metal within the feature to a first predetermined thickness in a physical vapor deposition (PVD) chamber; (b) depositing the metal within the feature to a second predetermined thickness in a first chemical vapor deposition (CVD) chamber; (c) etching the metal deposited in (b) to remove an overhang of the metal at a top of the feature in an etch chamber; and (d) subsequent to (c), filling the feature with the metal in a second CVD chamber.

In some embodiments, a cluster tool includes: a first transfer chamber; a chemical vapor deposition (CVD) chamber configured to deposit a metal coupled to the first transfer chamber; a physical vapor deposition (PVD) chamber configured to deposit the metal coupled to the first transfer chamber; and an etch chamber configured to etch the metal coupled to the first transfer chamber.

In some embodiments, a cluster tool includes: a first transfer chamber; two chemical vapor deposition (CVD) chambers configured to deposit a metal coupled to the first transfer chamber; a physical vapor deposition (PVD) chamber configured to deposit the metal coupled to the first transfer chamber; and two etch chambers configured to etch the metal coupled to the first transfer chamber.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
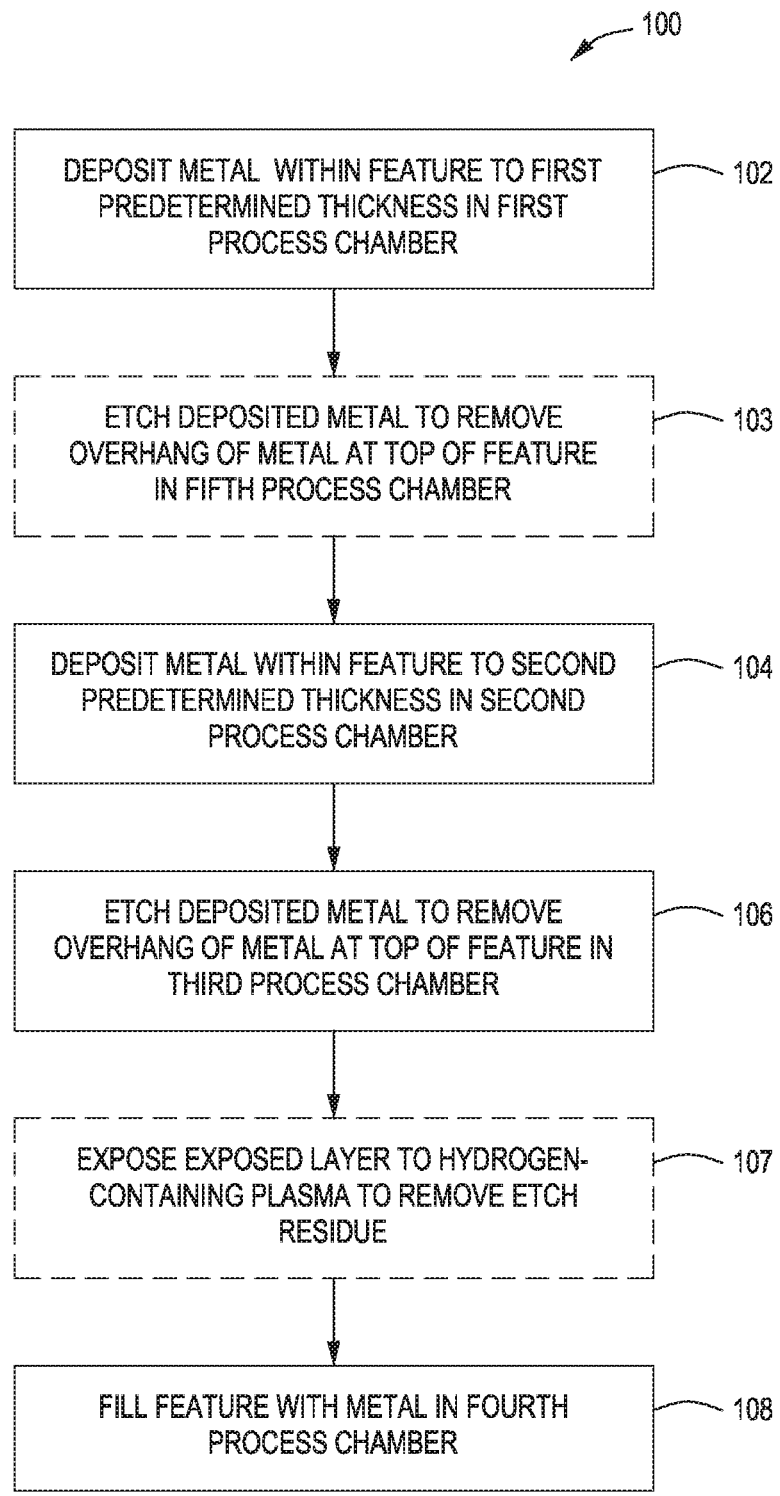
FIG. 1 depicts a flow chart of a method for etching a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for filling a feature in a substrate are provided herein. The inventive methods advantageously facilitate reducing or eliminating void formation during feature filling processes. The inventive methods may be utilized in the formation of metal interconnects in an integrated circuit, or in the formation of a metal gate or a metal-contact gap fill process, as well as other suitable applications where filling a feature may be performed.

FIG. 1 depicts a flow chart of a method 100 for processing a substrate in accordance with some embodiments of the present disclosure. The method 100 is described below with respect to the stages of processing a substrate as depicted in FIGS. 2A-2D and may be performed, for example, in a suitable reactor, such as is described below with respect to FIG. 3. Exemplary processing systems that may be used to perform the inventive methods disclosed herein may include, but are not limited to, any of the ENDURA®, CENTURA®, or PRODUCER® line of processing systems, commercially available from Applied Materials, Inc., of Santa Clara, Calif. Other process chambers, including ones available from other manufacturers, may also be suitably used in connection with the teachings provided herein.

Figure 2A:
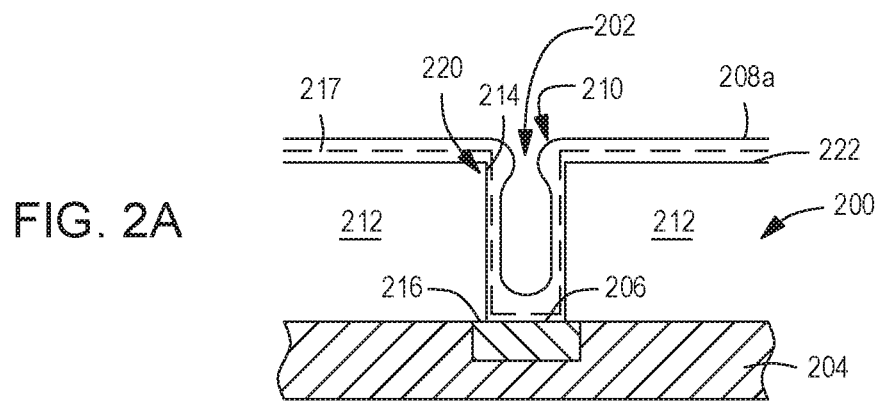
FIGS. 2A-D depict the stages of filling a feature in a substrate in accordance with some embodiments of the present disclosure.

The method 100 is typically performed on a substrate 200 provided to a processing volume of a process chamber, for example substrate processing chamber 332 described below with respect to FIG. 3. In some embodiments, as shown in FIG. 2A, the substrate 200 includes one or more features 202 (one shown in FIGS. 2A-D) to be filled, formed in a layer 212 of the substrate 200, and extending towards a base 204 of the substrate 200. Although the following description is made with respect to one feature 202, the substrate 200 may include any number of features 202. In some embodiments, a device 216, such as a logic device or the like, or a portion of a device requiring electrical connectivity, such as a gate, a contact pad, a conductive via, or the like, may be disposed in the base 204 of the substrate 200 and aligned with the feature 202. For example, the feature 202 may be filled with a conductive material to form a conductive pathway to the device 216.

The substrate 200 may be any suitable substrate having the feature 202 formed in the substrate 200. For example, the substrate 200 may comprise one or more of silicon (Si), silicon oxide ($SiO_2$), or the like. In some embodiments, the layer 212 may be a dielectric layer. In addition, the substrate 200 may include additional layers of materials or may have one or more completed or partially completed structures or devices formed in or on the substrate 200.

The feature 202 may be formed by etching the substrate 200 using any suitable etch process. In some embodiments, the feature 202 is defined by one or more sidewalls 214, a bottom surface 206 and upper corners 220. In some embodiments, the feature 202 may be a via, contact, trench, dual damascene, or the like. In some embodiments, the feature 202 may have a high aspect ratio, e.g., an aspect ratio between about of about 5:1 and about 15:1. As used herein, the aspect ratio is the ratio of a depth of the feature to a width of the feature.

In some embodiments, as shown in FIG. 2A, a first metal layer 208a is deposited atop a first surface 222 of the substrate 200 and within the feature 202 formed in the first surface 222. The first metal layer 208a may be deposited using any suitable deposition process(es), for example a PVD process, an atomic layer deposition (ALD) process, or a CVD process. In some embodiments, the first layer 208a is a conductive material used to fill the feature 202, for example, to form a conductive pathway.

In some embodiments, the first metal layer 208a is deposited on a barrier layer 217, which was already deposited on the substrate 200 in process chamber configured to deposit the barrier layer (e.g., substrate processing chambers 312, 314 discussed below). A "barrier layer," as used herein, may refer to a layer conformably formed along at least a portion of the sidewalls and/or lower surface of a feature such that a substantial portion of the feature prior to the deposition of the layer remains unfilled after deposition of the layer. In some embodiments, the barrier layer may be formed along the entirety of the sidewalls and lower surface of the feature. In some embodiments, the first layer is a metal containing layer. For example, in some embodiments, the first layer may contain tungsten (W), aluminum (Al), titanium (Ti), tantalum (Ta), oxides or nitrides thereof, silicides thereof, derivatives thereof, or combinations thereof. In some embodiments, the barrier layer may be titanium nitride (TiN), which is deposited in a chemical vapor deposition (CVD) chamber, such as any of substrate processing chambers 312, 314, described below with respect to FIG. 3.

In some embodiments, the thickness of the first metal layer 208a is greater proximate the upper corners of the opening than at the sidewalls and bottom of the opening. As a result, an overhang 210 forms at the edges of the first metal layer 208a surrounding the feature 202. In some embodiments, for example where the first metal layer 208a is deposited via a PVD process, the overhang 210 may form at least in part due to the disorderliness of the deposition process, such as ionized metal atoms traveling in multiple directions and are not all directed perfectly downward. 102-108, as described below, advantageously facilitate reducing or eliminating the void formed during feature filling processes.

The method begins at 102 by depositing the first metal layer 208a on the substrate 200 and in the feature 202 in a first process chamber. In some embodiments, the first metal layer 208a may be cobalt, nickel, or the like. The first metal layer 208a is deposited at 102 until a first predetermined thickness of the metal layer has been deposited. In some embodiments, the first predetermined thickness may be between about 3 nm and about 40 nm. In some embodiments, the first process chamber is a PVD chamber. In some embodiments, the first process chamber is a PVD process chamber configured to deposit cobalt or nickel. In some embodiments, the first process chamber is alternatively a CVD or an ALD chamber. In some embodiments, the first process chamber is a CVD process chamber configured to deposit cobalt or nickel. In some embodiments, the first metal layer 208a may be deposited using electrochemical or electroless deposition.

Figure 2B:
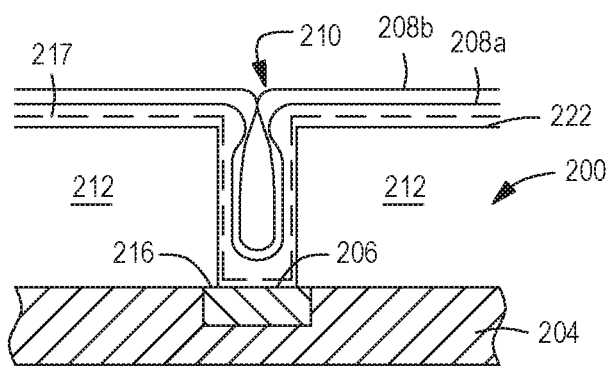
Figure 3:
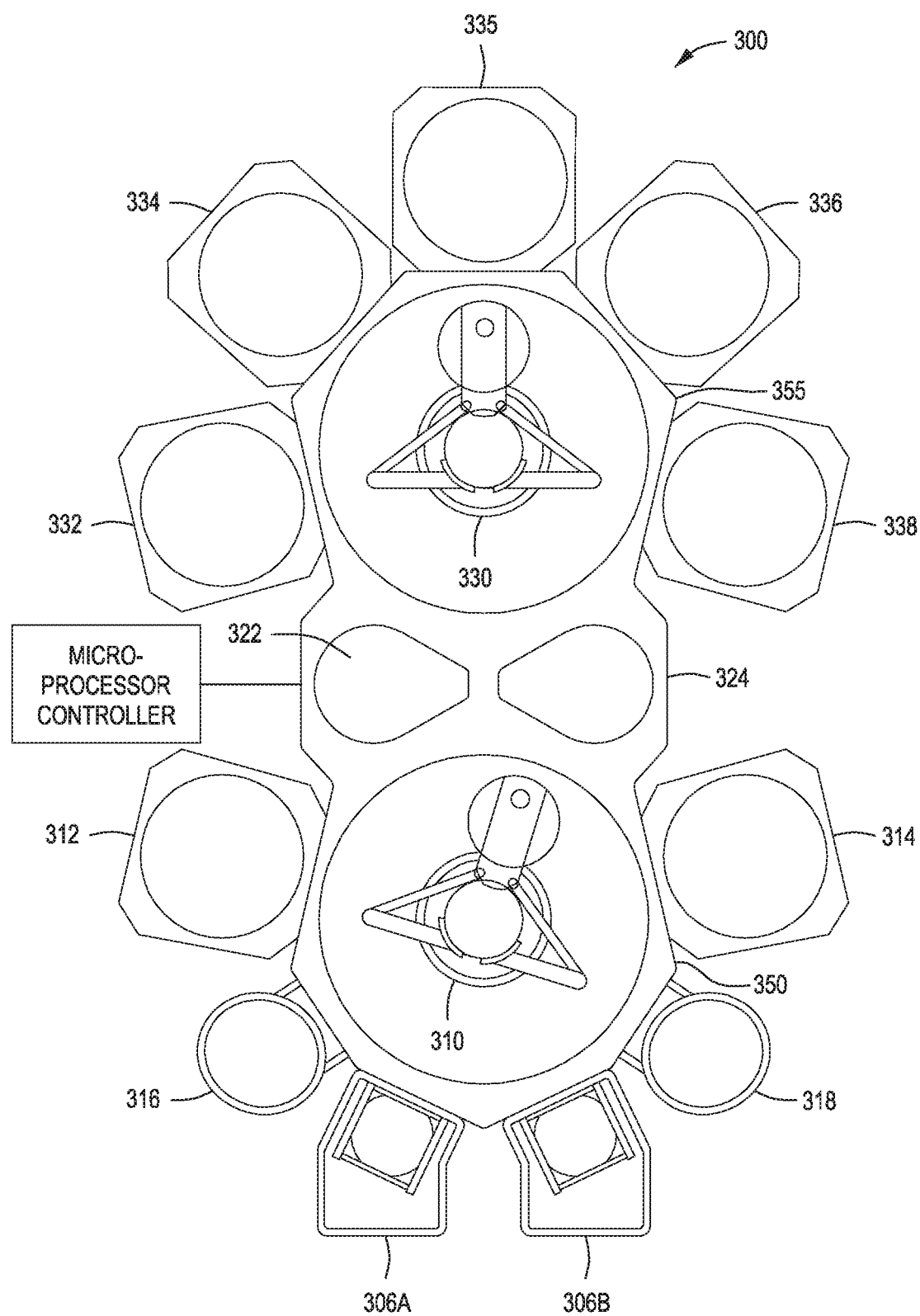
FIG. 3 depicts a process chamber suitable for performing a method of filling a feature in a substrate in accordance with some embodiments of the present disclosure.

At 104, a second metal layer 208b is deposited on the substrate 200 and in the feature 202 in a second process chamber, as shown in FIG. 2B. The second metal layer 208b is the same metal as the first metal layer 208a. Thus, the second metal layer 208b is also cobalt, nickel, or the like. The second metal layer 208b is deposited at 104 until a second predetermined thickness of the metal layer has been deposited. In some embodiments, the second predetermined thickness may be between about 3 nm and about 40 nm. In some embodiments, the second process chamber is a CVD chamber. In some embodiments, the second process chamber is a CVD process chamber configured to deposit cobalt or nickel. In some embodiments, the second process chamber may alternatively be an ALD chamber. In some embodiments, the second process chamber is an ALD process chamber configured to deposit cobalt or nickel. In some embodiments, the second metal layer 208b may be deposited using electrochemical deposition.

Figure 2C:
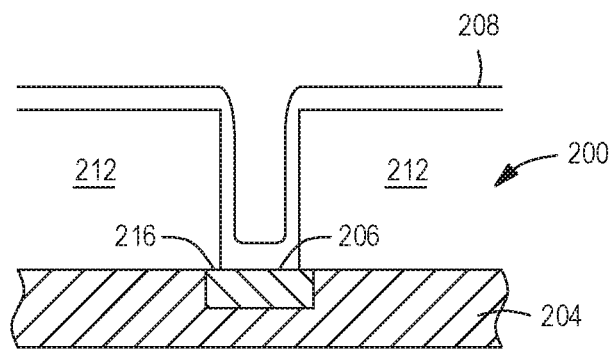
Figure 2D:
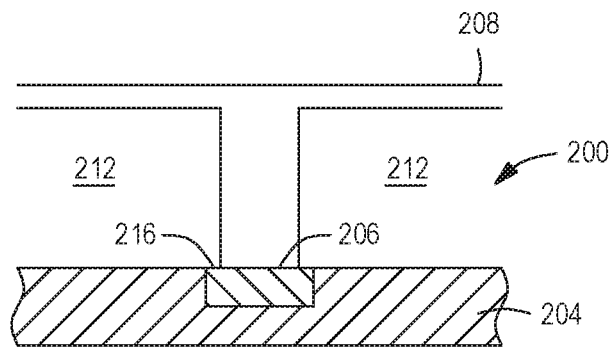

At 106, the first and second metal layers 208a, 208b (collectively referred to in the drawings as metal layer 208 in FIGS. 2C and 2D) are etched to remove a pinchoff of material created by the deposition processes at 102 and 104, as depicted in FIG. 2C. During etching, the exposed metal layer is oxidized using an oxidizing precursor. In some embodiments, the exposed metal layer is oxidized using a plasma formed with the oxidizing precursor. In some embodiments, the exposed metal layer is oxidized using the oxidizing precursor in a thermal process without the use of a plasma. In some embodiments, the oxidizing precursor includes a chlorine-containing agent. A purge gas is then flowed through the chamber to purge the oxidizing precursor from the chamber. Subsequently, the oxidized layer is then exposed to a reducing agent which etches away the oxidized layer by reacting with the oxidized layer to form a volatile organometallic. In some embodiments, the substrate is heated to a temperature between about 100° C. and about 250° C. during etching to accelerate the etch rate. Finally, a purge gas is again flowed through chamber to purge the organometallic product from the chamber. Examples of etching processes suitable for the etch process at 106 are described in commonly owned U.S. patent application Ser. No. 15/349,460, entitled "Selective Cobalt Removal For Bottom Up Gapfill," and filed on Nov. 11, 2016 to inventors Xikun Wang et al. Due to the pinchoff at the top of the feature, the metal layer at the bottom of the feature is masked during etching. As a result, the etching process may be performed between 1 and 10 times. The inventors have observed that as the number of etch cycles increases, the lateral etch rate exceeds the vertical etch rate. For example, in some embodiments the lateral etch rate exceeds the vertical etch rate by about 1.6 times. In some embodiments, the third process chamber is an etch chamber. In some embodiments, the third process chamber is an etch chamber configured to etch cobalt or nickel. In some embodiments, the third process chamber is an atomic layer etch chamber.

In some embodiments, the etching process just described may optionally also be performed at 103 in a fifth process chamber before depositing the second metal layer 208b at 104 to remove an overhang of material created by the deposition process at 102. In some embodiments, the fifth process chamber is an etch chamber. In some embodiments, the fifth process chamber is an etch chamber configured to etch cobalt or nickel. In some embodiments, the fifth process chamber is an atomic layer etch chamber.

After the etching process at 106, the exposed metal layer may optionally be exposed to a hydrogen-containing plasma at 107 to remove etch residue left behind by removal of the oxidized layer at 106. The exposed layer after the etching process is exposed to the hydrogen-containing plasma for a period of between about 10 second and about 300 seconds and the flow rate of the hydrogen gas is between about 500 sccm/s and about 4,000 sccm/s.

At 108, the feature is filled with the metal (e.g., the same metal is the first and second metal layers 208a and 208b) in a fourth process chamber different than the first and third process chambers, as depicted in FIG. 2D. In some embodiments, the deposition at 108 can continue after filling the feature to deposit an overburden atop the substrate, as shown in FIG. 2D. In some embodiments, the deposition at 108 can terminate upon filling the feature, and the substrate may be transferred to a different chamber to deposit the overburden. In some embodiments, the fourth process chamber is a CVD chamber. In some embodiments, the fourth process chamber is a CVD process chamber configured to deposit cobalt or nickel. In some embodiments, the fourth process chamber is a PVD chamber. In some embodiments, the fourth process chamber is a PVD process chamber configured to deposit cobalt or nickel. In some embodiments, from the deposition of the barrier layer to the filling of the feature, the substrate is always in a vacuum environment.

In some embodiments, the first metal layer 208a is deposited in a PVD chamber at 102, the second metal layer 208b is deposited in a CVD chamber at 104, and the feature is filled with the metal in a CVD chamber at 108. Alternatively, in some embodiments, the first metal layer 208a is deposited in a CVD chamber at 102, the second metal layer 208b is deposited in a CVD chamber at 104, and the feature is filled with the metal in a PVD chamber at 108.

The methods described herein may be performed in individual process chambers that may be provided in a standalone configuration or as part of one or more cluster tools, for example, an integrated tool 300 (i.e., cluster tool) described below with respect to FIG. 3. In some embodiments, the method 100 of processing a substrate described above may be performed in individual process chambers provided as a standalone chamber or as part of a cluster tool.

Examples of the integrated tool 300 include the CENTURA® and ENDURA® integrated tools, available from Applied Materials, Inc., of Santa Clara, Calif. However, the methods described herein may be practiced using other cluster tools having suitable process chambers coupled thereto, or in other suitable process chambers. For example, in some embodiments the inventive methods discussed above may advantageously be performed in an integrated tool such that there are limited or no vacuum breaks between processing steps.

The integrated tool 300 can include two load lock chambers 306A, 306B for transferring of substrates into and out of the integrated tool 300. Typically, since the integrated tool 300 is under vacuum, the load lock chambers 306A, 306B may pump down the pressure within the load lock chambers when substrates are introduced into the integrated tool 300. A first robot 310 may transfer the substrates between the load lock chambers 306A, 306B, and a first set of one or more substrate processing chambers 312, 314, 316, 318 (four are shown) coupled to a first transfer chamber 350. Each substrate processing chamber 312, 314, 316, 318, can be outfitted to perform a number of substrate processing operations. In some embodiments, the first set of one or more substrate processing chambers 312, 314, 316, 318 may include any combination of PVD, ALD, CVD, etch, or degas chambers. For example, in some embodiments, the processing chambers 312, 314, 316, 318 include two CVD chambers configured to deposit a barrier layer on a substrate and two degas chambers.

The first robot 310 can also transfer substrates to/from two intermediate transfer chambers 322, 324. The intermediate transfer chambers 322, 324 can be used to maintain ultrahigh vacuum conditions while allowing substrates to be transferred within the integrated tool 300. A second robot 330 can transfer the substrates between the intermediate transfer chambers 322, 324 and a second set of one or more substrate processing chambers 332, 334, 335, 336, 338 coupled to a second transfer chamber 355. The substrate processing chambers 332, 334, 335, 336, 338 can be outfitted to perform a variety of substrate processing operations including the method 100 described above in addition to, physical vapor deposition processes (PVD), chemical vapor deposition (CVD), etching, orientation and other substrate processes. In some embodiments, the second set of one or more substrate processing chambers 332, 334, 335, 336, 338 may include any combination of PVD, ALD, CVD, etch, or degas chambers. For example, in some embodiments, the substrate processing chambers 332, 334, 335, 336, 338 include at least one CVD chamber configured to deposit a metal, at least one PVD chamber configured to deposit the metal, and at least one etch chamber configured to etch the metal. For example, in some embodiments, the substrate processing chambers 332, 334, 335, 336, 338 include two CVD chambers configured to deposit the metal, a PVD chamber configured to deposit the metal, and two etch chambers configured to etch the metal. Any of the substrate processing chambers 312, 314, 316, 318, 332, 334, 335, 336, 338 may be removed from the integrated tool 300 if not necessary for a particular process to be performed by the integrated tool 300.

The disclosure may be practiced using other semiconductor substrate processing systems wherein the processing parameters may be adjusted to achieve acceptable characteristics by those skilled in the art by utilizing the teachings disclosed herein. While the foregoing is directed to embodiments of the present disclosure, other and further embodiments of the disclosure may be devised without departing from the basic scope thereof.

The invention claimed is:

1. A method of filling a feature disposed in a substrate, comprising:
   (a) depositing a metal within the feature to a first predetermined thickness in a first process chamber;
   (b) depositing the metal within the feature to a second predetermined thickness in a second process chamber;
   (c) etching via a plasma etching process the metal deposited in (b) to remove an overhang of the metal at a top of the feature in a third process chamber different than the first and second process chambers, wherein (c) comprises:
      (1) oxidizing an exposed layer of the metal deposited on the substrate using an oxidizing precursor;
      (2) purging the oxidizer precursor from the etch chamber;
      (3) flowing a reducing agent into the etch chamber to react with the oxidized layer and form an organometallic product and etch away the oxidized layer; and
      (4) purging the organometallic product from the etch chamber; and
   (d) subsequent to (c), filling the feature with the metal in a fourth process chamber different than the first and third process chambers.

2. The method of claim 1, wherein (a) is performed using physical vapor deposition and (b) and (d) are performed using chemical vapor deposition.

3. The method of claim 2, further comprising:
   (e) etching the metal deposited in (a) to remove an overhang of the metal at the top of the feature in a fifth process chamber prior to (b).

4. The method of claim 1, wherein (a) and (b) are performed using chemical vapor deposition and (d) is performed using physical vapor deposition.

5. The method of claim 4, further comprising:
   (e) etching the metal deposited in (a) to remove an overhang of the metal at the top of the feature in a fifth process chamber prior to (b).

6. The method of claim 1, wherein the first and second predetermined thicknesses are each between about 3 nm and about 40 nm.

7. The method of claim 1, wherein the metal is cobalt or nickel.

8. The method of claim 1, wherein the oxidizing precursor includes a chlorine-containing agent.

9. The method of claim 1, wherein oxidizing the exposed layer of the metal includes using a plasma formed from the oxidizing precursor.

10. The method of claim 1, wherein the substrate is heated to a temperature between about 100° C. and about 250° C. during etching.

11. The method of claim 1, wherein (c) is performed between 1 and 10 times.

12. The method of claim 1, further comprising:
   exposing the exposed layer to a hydrogen-containing plasma to remove etch residue after removal of the oxidized layer.

13. A method of filling a feature disposed in a substrate, comprising:
   (a) depositing a metal within the feature to a first predetermined thickness in a physical vapor deposition (PVD) chamber;
   (b) depositing the metal within the feature to a second predetermined thickness in a first chemical vapor deposition (CVD) chamber;
   (c) etching via a plasma process or a thermal process without the use of a plasma the metal deposited in (b) to remove an overhang of the metal at a top of the feature in an etch chamber; and
   (d) subsequent to (c), filling the feature with the metal in a second CVD chamber; and
   (e) etching the metal deposited in (a) to remove an overhang of the metal at the top of the feature in a second etch chamber prior to (b), wherein each of (c) and (e) comprises:
      (1) oxidizing an exposed layer of the metal deposited on the substrate using an oxidizing precursor;
      (2) purging the oxidizer precursor from the etch chamber;
      (3) flowing a reducing agent into the etch chamber to react with the oxidized layer and form an organometallic product and etch away the oxidized layer; and
      (4) purging the organometallic product from the etch chamber.

14. The method of claim 13, wherein the metal is cobalt or nickel.

15. The method of claim 13, further comprising:
   exposing the exposed layer to a hydrogen-containing plasma to remove etch residue after removal of the oxidized layer.

* * * * *